United States Patent [19]

Waas

[11] Patent Number: 4,475,646

[45] Date of Patent: Oct. 9, 1984

[54] APPARATUS AND METHOD FOR CONVEYING FLAT MEMBERS THROUGH A PROCESSING UNIT

[75] Inventor: Frank F. Waas, Bad Homburg, Fed. Rep. of Germany

[73] Assignee: E. I. Du Pont de Nemours and Company, Wilmington, Del.

[21] Appl. No.: 435,930

[22] Filed: Oct. 22, 1982

[30] Foreign Application Priority Data

Nov. 7, 1981 [DE] Fed. Rep. of Germany ....... 3144355

[51] Int. Cl.$^3$ .............................................. B65G 47/84
[52] U.S. Cl. .................................... 198/480; 198/482; 198/655
[58] Field of Search ............... 198/480, 482, 624, 649, 198/652, 655, 656, 796

[56] References Cited

U.S. PATENT DOCUMENTS

| | | | |
|---|---|---|---|
| 1,006,982 | 10/1911 | Rust | 198/649 |
| 1,217,990 | 3/1917 | Paridon | 198/655 X |
| 3,311,500 | 3/1967 | Seto | 198/796 |
| 3,869,969 | 6/1973 | Sharp | 99/327 |
| 4,116,597 | 9/1978 | Dunstan | 198/624 |
| 4,338,391 | 7/1982 | Nacci | 430/122 |

*Primary Examiner*—Robert J. Spar
*Assistant Examiner*—Jonathan D. Holmes

[57] ABSTRACT

Apparatus for conveying flat, preferably plate-shaped members that have previously been processed on one or both surfaces through a processing unit, for example, conveying printed electrical circuit boards through a circulating air drying or auxiliary finishing oven, includes a rotor having more than one receptor device for accepting the members individually, which receptor devices are situated on the periphery of a hub-shaped carrier. The rotor is driven to rotate in a stepwise fashion corresponding to the arrangement of the receptor devices. Elements for loading and unloading the members, that function within the periphery of the rotor are also provided.

18 Claims, 8 Drawing Figures

APPARATUS AND METHOD FOR CONVEYING FLAT MEMBERS THROUGH A PROCESSING UNIT

BACKGROUND OF THE INVENTION

This invention relates to the manufacture of printed circuit boards, and in particular, to an apparatus and method for conveying boards that have a circuit pattern formed thereon through a circulating air dryer or finishing oven.

During the manufacture of printed circuit boards a resist material is applied to the board using a magnetic printing process. In this process a circuit pattern of magnetized toner is transferred to the board from a printing cylinder the surface of which has been magnetized in the pattern of the circuit. The soft, sensitive toner image on the board is then annealed by heat treatment before further processing of the board may take place. This process is described in more detail in U.S. Pat. No. 4,338,391 (Nacci et al.).

Until now infrared radiation has been used for heat treating such circuit boards that are printed on one or both sides. However this has entailed a risk of damaging (e.g. permanently distorting or buckling) the board's substrate because of the high energy density required. In particular, a thin circuit board and, even more particularly, a thin board coated on one side, tends to sag in the direction of the heat source due to the bimetallic effect. In addition, since the radiant energy varies inversely as the square of the separating distance the continuous radiation process involves unusual problems due to nonuniform distribution of temperatures between the center and the outer areas of the circuit board. Since the circuit board is usually printed out to the edge, and since the printed surfaces must not be touched until they are completely hardened, heat treatment by infrared radiation involves significant problems in conveying the board through the treatment unit. Still further, serious problems existing in connection with conveying the circuit board have so far prevented the use of uniformly heating and gently working circulating air ovens.

It is therefore believed advantageous to provide an apparatus and method in which a flat planar member, such as a printed circuit board, is conveyed through a recirculating air dryer or finishing oven. It is believed to be of further advantage to hold the planar member during its treatment in a receptor device or basket without the risk of the surface of the member being touched by the basket. It is believed to be of yet further advantage to permit the planar member to move within the basket in which it is carried to position itself properly for the treatment being conducted on it without risking the danger of buckling.

SUMMARY OF THE INVENTION

This invention relates to an apparatus and method for conveying a flat, preferably plate-shaped, member that has been previously treated on one or both sides through a treatment unit, for example, for conveying a printed electrical circuit board through a circulating air dryer or auxiliary finishing oven. The conveying apparatus includes a rotor having at least one but preferably a plurality of receptor devices, or baskets, each of which is adapted to receive a single member therein. The baskets are comprised of two or more loops formed of wire or metal tape. The baskets are mounted about the periphery of and extend radially outwardly from a carrier or hub affixed to a shaft. The loops which form the baskets are closed all around and exhibit a cross-section which bulges in the center and converges in the radial inward and outward directions. Members carried within the baskets are touched only at their edges and are afforded considerable freedom of movement while within the baskets. The rotor is stepwise advanced to place each basket in adjacency to a loading/unloading station. Loading and unloading of the members is effected axially with respect to the shaft by an array of transport rollers that are arranged in rows that extend parallel to the axis of the shaft. Some of the rollers are mounted for rotation. The rollers in each row are movable from a spaced-apart or open position to a closed position in which pairs of rollers (one from each row) act in concert to load and/or unload a member into or from a basket. The rollers, when in the closed position, intrude into the radially outer end region of each basket as the basket is situated at the loading/unloading station. One roller in each pair is provided with a sloping tapered surface which is engageable with a member carried in a basket so that, while the roller is in the closed position, the member is lifted out of the radially outer end of the basket. When the member is so lifted rotation of at least one of the rollers in a row acts against the member to advance the lifted member axially out of the basket. The conveying apparatus may also include a safety switch that operates in response to an overload or if the rotor is stopped for any reason, as for example, by an improperly unloaded member.

BRIEF DESCRIPTION OF THE DRAWINGS

The invention will be more fully understood from the following detailed description thereof taken in connection with the accompanying drawings which form a part of this application and in which.

DETAILED DESCRIPTION OF THE INVENTION

Throughout the following detailed description similar reference numerals refer to similar elements in all Figures of the drawings.

Figure 1:
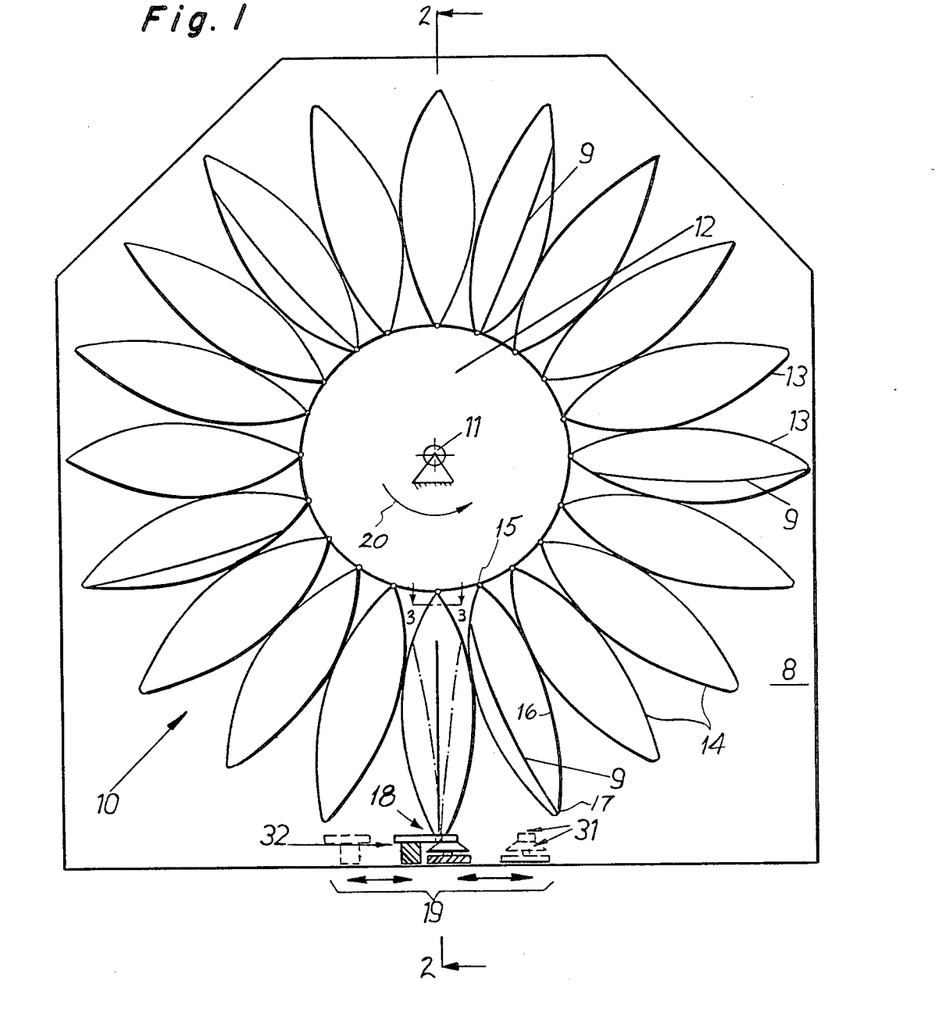
FIG. 1 is a schematic front view of a conveying apparatus in accordance with the present invention.
Figure 2:
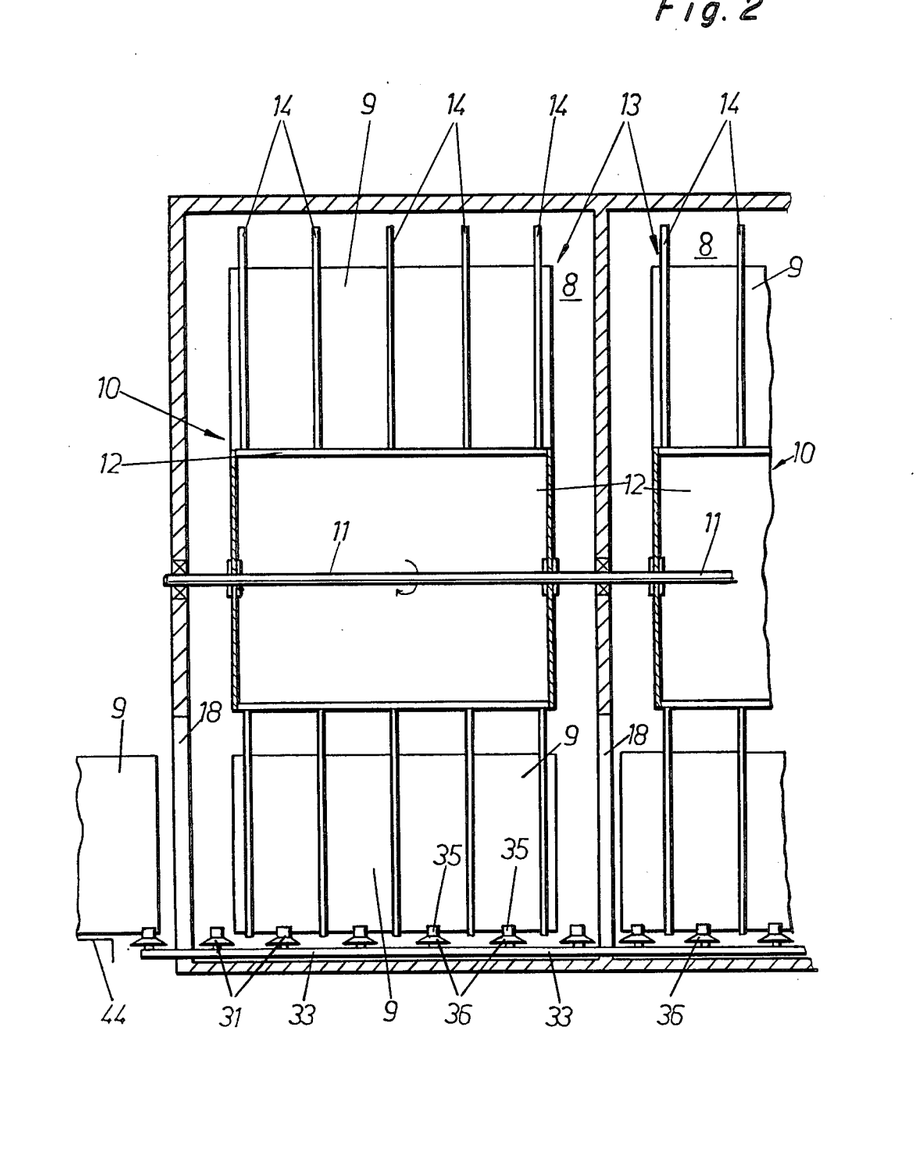
FIG. 2 is a view in longitudinal section taken along section lines 2—2 in FIG. 1 showing a two-phase treatment unit in accordance with the present invention.

With reference to FIGS. 1 and 2 a shaft 11 is situated horizontally in the center of a treatment unit such as an air circulating dryer or finishing oven 8 through which it is desired to convey flat, plate shaped, members such as circuit boards 9. The shaft 11 supports one or more axially disposed rotors 10 that receive the members in a manner to be discussed. Each rotor 10 has a carrier 12 firmly attached to the shaft 11. On the perimeter of this carrier 12 there is a radially arranged system of receptor devices or guide baskets. In the Figures the carrier 12 is shown to have twenty baskets 13.

Each of the baskets 13 comprises individual curved loops 14 formed of wire or metal tape. Two or more loops 14 may be used to form each of the baskets 13. FIG. 2 shows that as an example five such loops 14 can be used to define a basket 13. Because of this construction of individual metal tape or wire loops 14 the guide baskets 13 are open on both front and rear sides (axially with respect to the shaft 11) and also are open at the sides for warm air to pass through.

The radial length of the metal tape and/or wire loops 14 used to form the basket is greater than the width of the circuit boards 9 to be treated. As FIG. 1 shows, each loop 14, and therefore each basket 13, has a bulbous cross-section extending in an essentially arched bulge from each narrowing inner extremity 15 that practically converges to a point where it is attached to the carrier 12 over a bulbous, expanded central part 16 to a radially external extremity 17 that is also narrowed and converges practically to a single point. The circuit boards 9 can thus freely and loosely glide into a closed lattice that bulges on both sides such that the boards 9 come into contact with the lattice only along the longitudinal edges. Thus, the surfaces of the boards 9 are effectively protected from contact with the basket. While within the basket the boards retain considerable freedom of movement. Thus, bracing and thereby the risk of buckling during treatment is avoided.

The rotor 10 is motor driven, specifically by a stepwise, cyclical drive by means of which each forward step moves one basket 13 after another into adjacency to a loading and unloading station 28 (shown at the lower portion of FIG. 1), holds it there long enough for loading and unloading of a member, and then moves in a further step forward in the direction of arrow 20. During each stop of the rotor 10, the circuit board 9 is taken from the basket 13, and a new circuit board 9 is axially introduced into the guide basket 13 by means of a loading and unloading device generally indicated by reference character 19. In this manner each circuit board 9 remains in the dryer 8 for one total revolution of the rotor 10. Loading and unloading of the boards 9 is effected by the same device 19, through slots 18 (FIG. 2) in the dryer shell. Thus, as one treated member is unloaded a member to be treated is simultaneously introduced into the appropriate guide basket. Quite apart from the fact only one device is needed for both loading and unloading, this means that the treatment unit can extend over the entire periphery of the rotor for maximum practicality.

As shown in FIG. 2, the dryer 8 may have two or more phases, with each phase having a rotor 10. The rotors 10 are of identical construction and have correspondingly arranged guide baskets 13. A common loading and unloading device 19 is provided that extends over the entire length of all the phases. The circuit board 9 from the first phase that is taken from a guide basket 13 on the rotor 10 in that phase goes directly into a simultaneously emptied guide basket 13 on the rotor 10 in the second phase. Thus phased treatment can be arranged to fit the particular requirements involved, for example, a heating phase and a cooling phase or the like.

Figure 3:
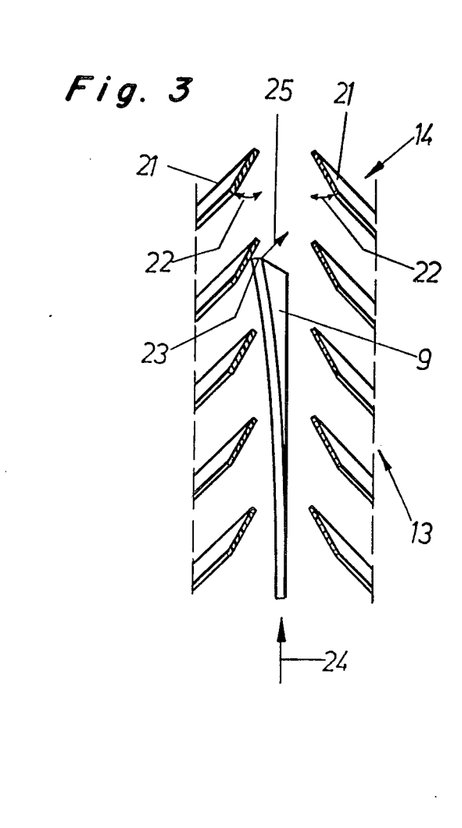
FIG. 3 is an expanded view of a receptor device or basket taken along section lines 3—3 of FIG. 1.
Figure 4:
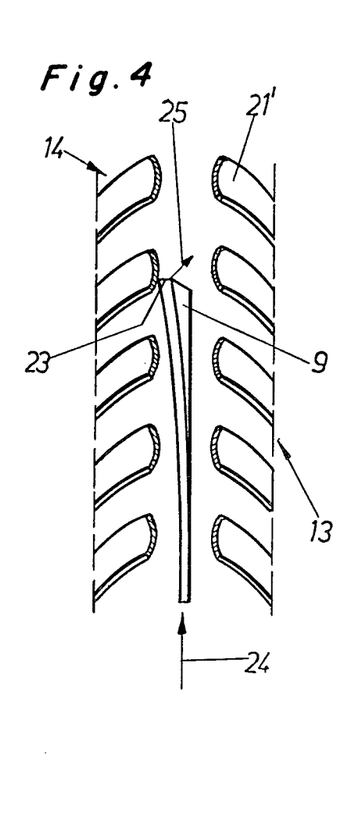
FIGS. 4 and 5 are views similar to FIG. 3 each respectively showing modified baskets in accordance with the present invention.
Figure 5:
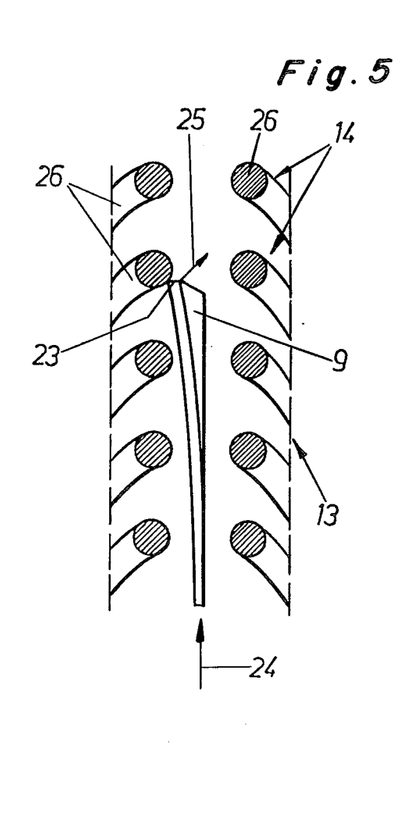

As may be seen in FIGS. 3 to 5, loading into the individual guide baskets 13 can be substantially facilitated if the loops 14 have deflecting surfaces at least in the radially inner narrowing part of the loop. If, for example, a slightly warped circuit board 9 is loaded the upper front corner area 23 of such a warped circuit board 9 can come into contact with the loop 14. The deflecting surfaces built into the loops then guide this upper corner area of the circuit board 9 safely into the interior of the loop, and prevent the circuit board 9 from hooking onto the loop 14. As shown in FIG. 3, if sheet metal tapes 21 form the loops 14 the loops have, at least in the narrowing radial inner part of the loop 14, a funnel shape that opens towards the loading side. Each side of the loop 14 has a deflecting surface, or warping, 22, on which the upper corner 23 of a warped circuit board can slide when the board is introduced into the loop 14. This deflecting surface converts the inserting force shown by arrow 24 into a deflecting force shown by arrow 25 directed into the loop 14 that is involved. The deflecting surface 22 that in FIG. 3 is shown only in the inner part of the loops 14 can also extend over the entire length of the loop 14.

As FIG. 4 shows, practically the same effect can be obtained if the metal tapes 21' forming the loops 14 have the profile of a circular arc, at least in the radially inner portion of the loop, and are arranged with their concave surface on the inner side of the loop 14. In this case also the corner 23 of a warped circuit board 9 will impinge on the rounded concave inner surface of the metal tape 21' of a loop 14, and a deflecting force 25, directed into the interior of the loop, will be generated by the force of insertion 24.

In the example shown by FIG. 5 the loops 14 are formed of round wires 26. These round wires constitute a natural deflecting surface for deflecting the corner 23 of a warped circuit board 9. In this case also the force 24 applied to insert the board 9 into the guide basket 13 is converted into a deflecting force 25 directed into the interior of the loop by impingement of the corner 23 on a loop 14.

Figure 6:
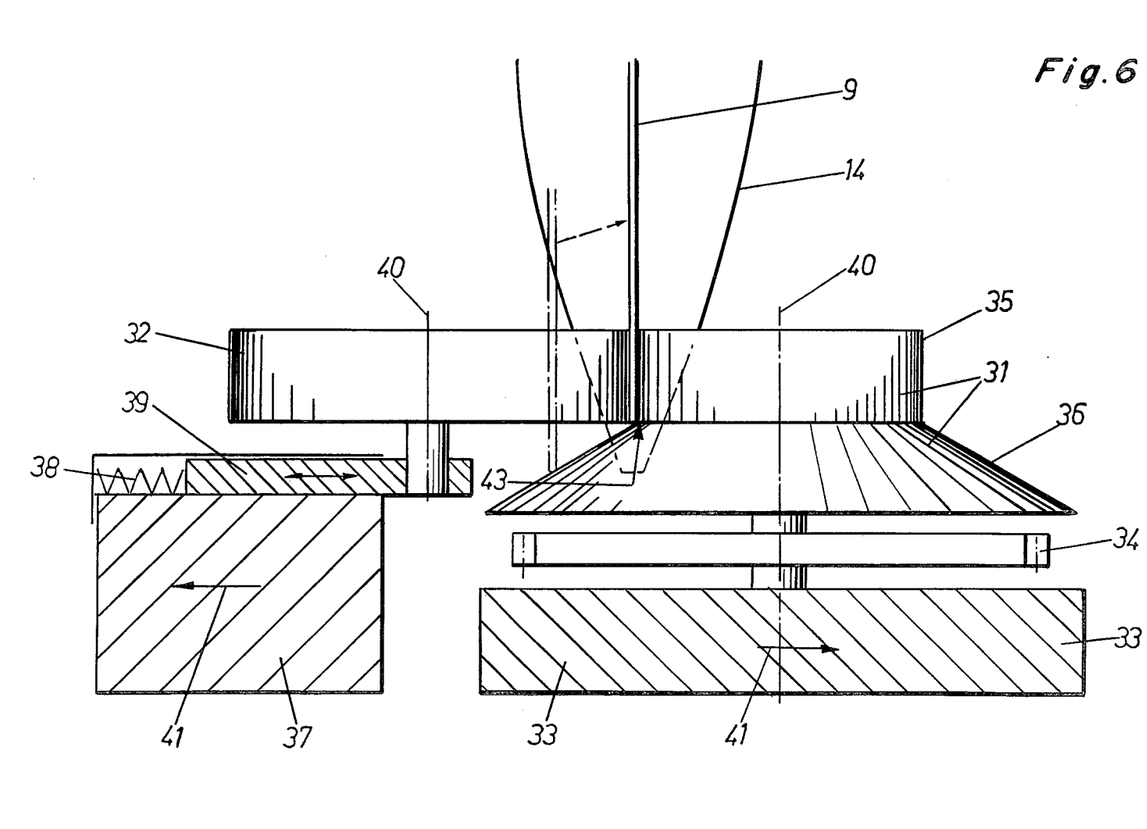
FIG. 6 is an expanded front view of the transport rollers shown in the lower portion of FIG. 1 while the rollers are in the closed position.

As may be seen from FIGS. 1, 2, 6 and 7, the combined loading and unloading device 19 is situated beneath the rotor 10. The device 19 has two rows of transport rollers 31 and 32, each row extending parallel to the axis of the shaft 11. The rollers 31 of the one row are situated on a support plate 33. At least some of the rollers 31 are rotatable, and can be driven by a chain drive (FIG. 8). The peripheral surface 35 of these rollers 31 is a frictional surface. Beneath the peripheral frictional surface 35, these rollers 31 are structured as tapered butting surfaces 36. The second row 32 of transport rollers is located on a support plate 37. Each of these rollers 32 is built as a counter pressure roller and can be rotated by a guide bar 39 that is laterally movable against the force of a pressure spring 38. The rotational axes 40 of the rollers 31 and 32 are arranged so that when in the completely joined position the rollers 31 and 32 are brought together in pairs (one from each row) as shown in FIG. 6, the axes 40 are practically radial relative to the rotor 10.

From the position shown in FIG. 6, the support plates 33 and 37 with the rollers 31 and 32 can be moved apart as shown by the arrow 41 (FIG. 6) to a position in which the rollers 31 and 32 are outside the movement area of the rotor 10, as designated by the dotted lines in FIG. 1. The rollers 31 and 32 are so arranged on the support plates 33 and 37 that when brought together, one roller 31 and one roller 32 form an opposing roller pair that lifts up the member to be conveyed, for example a circuit board 9. The paired joining of the rollers has the advantage that a member to be loaded or unloaded is brought to a definitive upright position in which it may be brought into or out of a basket with exceptional security by an axial conveying motion.

Figure 7:
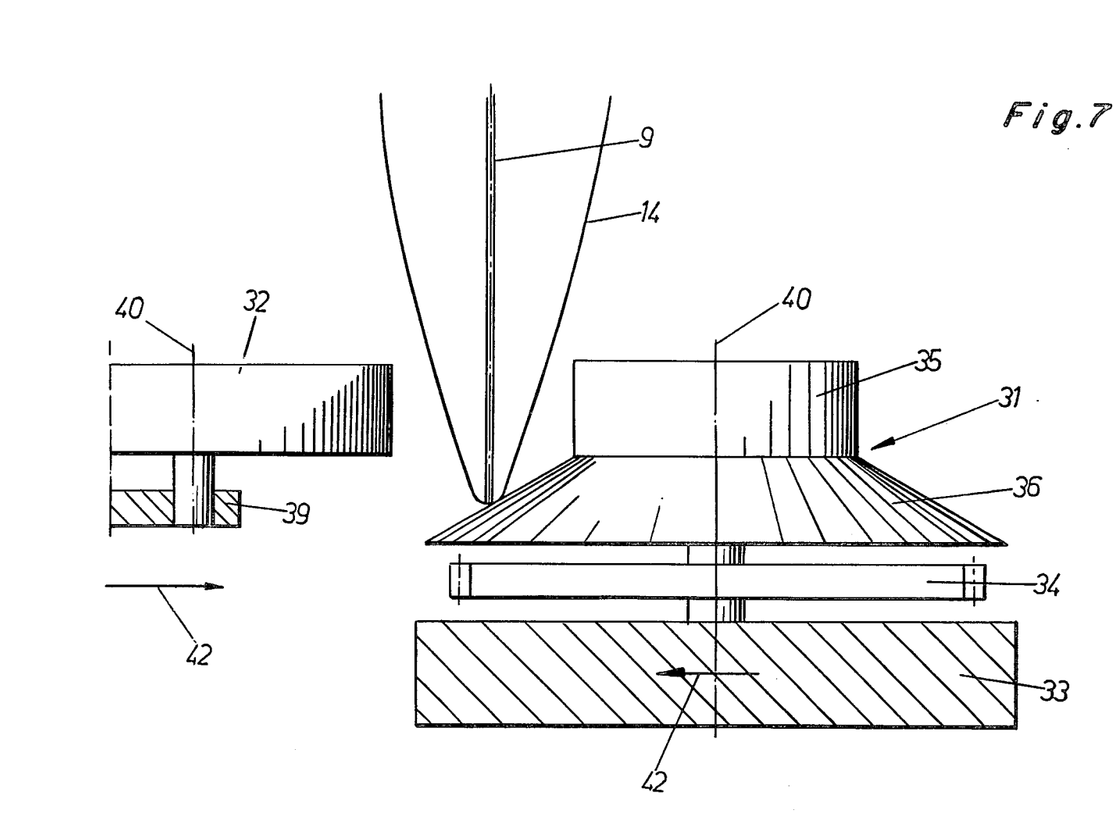
FIG. 7 is a view similar to FIG. 6 illustrating the transport rollers in the open position.
Figure 8:
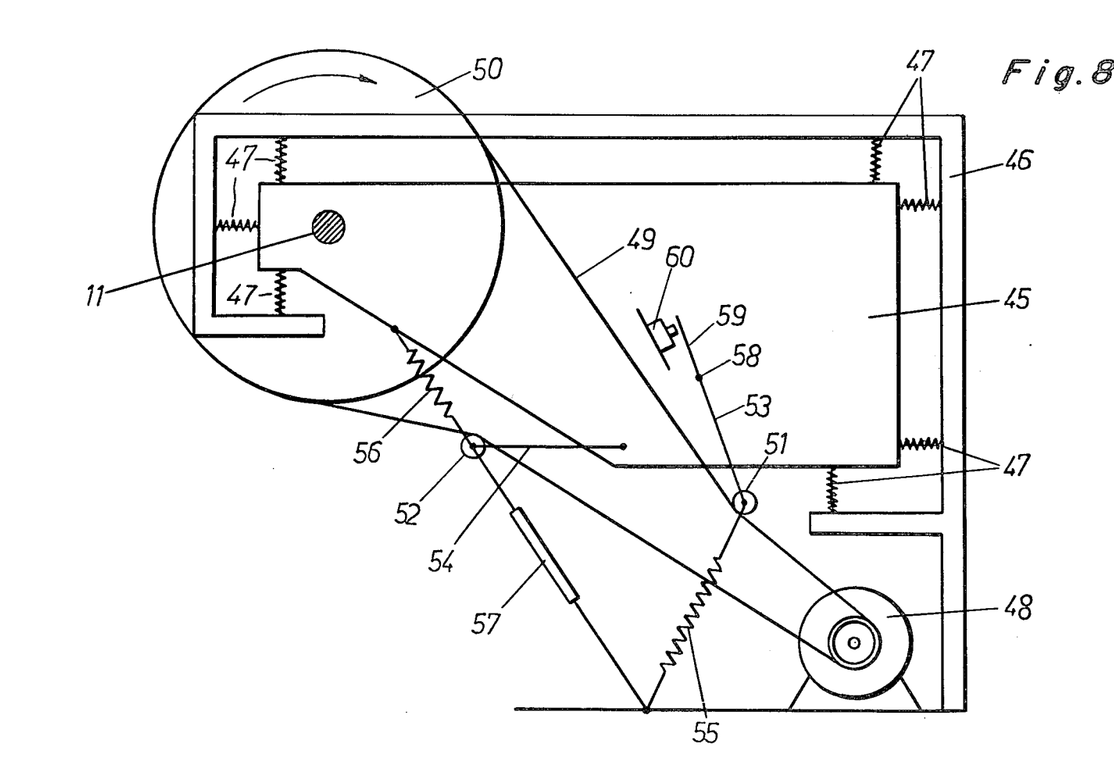
FIG. 8 is a schematic view of the drive system of a conveying apparatus in accordance with the present invention.

As may be seen by comparing FIGS. 6 and 7, when the support plates 33 and 37 are brought together, the tapered butting surface 36 of the roller 31 extends under the edge of a board located in the radially outer extremity of the loop 14 of a basket 13. The corners and edges of the boards 9 are held at a safe distance from the end part of the basket, so that the surfaces of the boards do not strike against parts of the basket. By the interaction of the loop 14 and the tapered butting surface, and assisted by the arrival of the roller 32, the circuit board 9 is lifted to the desired degree from the radially outer end of the loop 14 (as shown by dotted lines in FIG. 6). In a similar manner, the tapered butting surface 36 and the roller 32 acting as counter-pressure rollers lift a board to be introduced opposite an entry way 44 (see FIG. 2) that is located at the entry to the treatment unit. A board in a correspondingly positioned basket 13 on the rotor 10 in the second phase is similarly lifted by the action of the rollers 31 and 32. Rotation of the rollers simultaneously axially advances a new board into the basket on the rotor in the first phase, a board from the basket on the rotor in the first phase to a basket on a rotor in the second phase, and form a basket on the rotor in the second phase to a further point. Consequently, all members at the loading/unloading station are simultaneously conveyed from the rotor of one treatment unit to the rotor of the following treatment unit, the member that previously was in the last treatment phase is taken out, and a new member is introduced into the first treatment phase. This simultaneous axial advancement of the members prevents any accumulation of pieces between the successive treatment phases and/or the treatment units. Advance of the board for loading and unloading is thus effected axially relative to the rotor 10 and is practically autonomous.

As shown in FIG. 8, the conveying apparatus disclosed herein can also have safety devices protecting against overloading and, most important, against stoppages, for example those caused by incomplete or incorrect axial introduction and/or withdrawal of a board 9 being treated. In addition for quiet and reliable operation the mounting of the rotor may be elastic and shock absorbent. FIG. 8 shows that the rotor shaft 11 is secured in a base support that has a shock-absorbing spring connection to the frame 46 of the apparatus 36. This is indicated by the spring and shock absorber components 47 in FIG. 8. A drive train linkage, e.g., a V-belt or, still better for precise drive control, a drive chain 49, connects the output gear of a drive motor 48 that is secured to the frame 46, with the driven gear 50 of the rotor shaft 11. Two idler wheels or gears 51 and 52 that engage the drive chain 49 are positioned on a base support 45. The idler gears 51 and 52 are held against the drive chain 49 by a predetermined force by means of tension springs 55 and 56. Between the idler 52 and the frame 46 there is also a shock absorbing component 57, to inhibit vibrations of the basket. As FIG. 8 indicates, the wishbone 53 of the idler 51 situated on the tension side of the drive chain is extended beyond its pivoting point 58 by a control lever arm 59. This control lever arm 59 is opposed to a safety switch 60 that is mounted on the base support 45. If overloading of the rotor drive occurs during operation of the apparatus, or if the rotation of the rotor is prevented for any reason, e.g., by an incompletely unloaded or incompletely inserted member, a greater tensile stress is applied to the section of the drive chain 49 under tension, and it stretches in opposition to the force exerted by the spring 55 and the spring 56. This causes the lever arm 59 to activate the safety switch 60, which in turn switches the motor off. The spring load on the idler 51 and the extent that the lever arm 59 is displaced may be predetermined to insure that a predetermined applied torque will cause the activation of the switch 60.

Variations from the example shown are of course possible within the scope of the invention. Thus, instead of a circulating air oven the treatment unit may be a drying and finishing oven of a different type. The treatment unit may also be an apparatus for gaseous phase chemical surface treatment of the members or also an apparatus for treating the members in a liquid. In the latter case, the loading and unloading station is located in the upper area of the rotor 10, and the structures of the loading and unloading devices are appropriately modified.

In addition to, or as a modification of, the example shown, the baskets can be self-centering relative to withdrawal of the members into the loading and unloading devices and/or can align themselves with the loading and unloading station. For this, the baskets can be mounted or formed with sufficient elastic flexibility in the peripheral direction of the rotor 10. Thus the members taken up by the loading and unloading device align the guide basket that is at the loading and/or unloading station with the loading and unloading station. However, there can also be in the rotor drive an elastically flexible component for adequately limited twisting of the rotor shaft 10. By this means, the member situated at the unloading-loading station adjacent to the loading-unloading device accepting it aligns the proper guide basket in the loading-unloading station by appropriate twisting of the entire rotor against the force exerted by the elastically flexible component.

Those skilled in the art, having had the benefit of the teachings of the present invention as hereinabove set forth may effect numerous modifications thereto. Such modifications are to be construed as lying within the contemplation of the present invention, as defined in the appended claims.

What is claimed is:

1. An apparatus for conveying flat members previously processed on one or both surfaces through a processing unit in where there is a rotor having a plurality of receptor devices for accepting the members individually, the receptor devices being situated on the periphery of the rotor, the rotor being rotatable to displace the receptor devices in a stepwise fashion past a predetermined loading/unloading station, and means for loading and unloading the members being disposed in adjacency to the station and adapted to function within the periphery of the rotor, wherein the improvement comprises:

each of the receptor devices comprising an open basket (13) formed by two loops (14) each having a cross-section that is closed all around, each basket expanding bulge-like towards the center and sharply converging radially inward and outward;

the loading and unloading means (19) being disposed beneath the rotor (10) and comprising two rows of transporting rollers (31, 32) a predetermined number of which are rotatably driveable, each row of rollers extending parallel to the rotation axis (11) of the rotor (10), the rollers in each row being movable from an open to a closed position, the rollers when in the closed position being disposed with their rotational axes (40) substantially radial to the rotor and being adapted to engage a member in the radially outermost area of the basket that is disposed at the loading or unloading station (28) to lift a member within the basket and advance the member axially out of the basket.

2. The conveying apparatus of claim 1 wherein each loop is formed of sheet metal tape (21) that is wound funnel-fashion expanding toward the loading side of the basket (13).

3. The conveying apparatus of claim 2 wherein the metal tape is wound in an expanding funnel fashion only in the radially interior portion of the loop.

4. The conveying apparatus of claim 1 wherein each loop is formed of sheet metal tape (21) that has an arched profile with the concave surface of the profile extending toward the interior of the loop.

5. The conveying apparatus of claim 1 wherein each loop is formed of a wire (26) having a circular cross section.

6. The conveying apparatus of claim 1 wherein the transport rollers (31, 32) are disposed so that a roller in one row is paired with a roller in the other row when the rollers are in the closed position.

7. The conveying apparatus of claim 6 wherein one of the rollers in each pair has a tapered surface (36) for lifting a member from the radially outer extremity of the basket (13).

8. The conveying apparatus of claim 7 wherein the roller with the tapered surface (36) is rotatably driveable.

9. The conveying apparatus of claim 6 further comprising a rotor drive train having a drive motor (48) for rotating the rotor (10) and a safety switch (60) for switching off the drive motor when the driving torque applied to the rotor exceeds a predetermined value.

10. The conveyed apparatus of claim 9 wherein the rotor drive train has a drive linkage with a spring-mounted tensioning wheel (51) and wherein the safety switch has an actuating lever (59) that is operatively controlled by the position of the wheel (51).

11. The conveying apparatus of claim 10 wherein the drive linkage is a chain.

12. The conveying apparatus of claim 9 wherein the rotor (10) is mounted with an elastic and shock-absorbent mount.

13. The conveying apparatus of claim 10 wherein the rotor (10) is mounted with an elastic and shock-absorbent mount.

14. The conveying apparatus of claim 11 wherein the rotor (10) is mounted with an elastic and shock-absorbent mount.

15. The conveying apparatus of claim 1 wherein the processing unit has a first and a second phase, each phase having a rotor with receptor devices situated on the periphery, each rotor being mounted on a common shaft such that rotation of the shaft disposes corresponding receptor devices on each rotor past a loading-/unloading position therebeneath, and wherein the loading and unloading means (19) extends beneath both rotors in adjacency to the station associated with each rotor.

16. A method for conveying flat members previously processed on one or both sides through a processing unit in which there is a rotor having a plurality of receiving devices on the periphery thereof, the rotor being rotatable in a stepwise fashion to dispose each receptor device past a predetermined loading/unloading station, the method comprising the steps of:
(a) moving each roller in a row of rollers aligned in parallel with the axis of the rotor toward a corresponding roller in a second row of rollers also aligned in parallel with the axis of the rotor so that the axes of the rotation of the rollers are radial to the rotor;
(b) lifting a member disposed within the receptor device proximal to the loading/unloading station by the action of a tapered surface on each of the rollers of one row;
(c) rotating some predetermined number of the rollers in one of the rows to advance the lifted member axially out of the receptor device and simultaneously advance another member axially into the receptor device;
(d) moving the rollers away from each other to permit the member advanced into the receptor device to be supported therein without the surface of the member being engaged by the receptor device; and
(e) rotating the rotor to dispose another receptor device into proximity with the station and repeating steps (a) to (e).

17. The method of claim 16 further comprising the step of:
introducing the member axially advanced out of the receptor device in step (c) into a corresponding receptor device on a second rotor spaced axially from the first action.

18. The method of claim 16 further comprising the step of:
halting rotation of the rotor when the driving torque applied to the rotor exeeds a predetermined value.

* * * * *